United States Patent [19]
Goto

[11] Patent Number: 5,157,680
[45] Date of Patent: Oct. 20, 1992

[54] INTEGRATED SEMICONDUCTOR LASER

[75] Inventor: Katsuhiko Goto, Itami, Japan

[73] Assignee: Mitsubishi Denki Kabushiki Kaisha, Tokyo, Japan

[21] Appl. No.: 769,374

[22] Filed: Oct. 1, 1991

Related U.S. Application Data

[62] Division of Ser. No. 607,738, Nov. 1, 1990.

[30] Foreign Application Priority Data

Nov. 8, 1989 [JP] Japan .................................. 1-290641

[51] Int. Cl.$^5$ ................................................. H01S 3/19
[52] U.S. Cl. ........................................ 372/50; 372/23; 372/46
[58] Field of Search ................ 372/23, 46, 50, 45, 372/44

[56] References Cited

U.S. PATENT DOCUMENTS

| | | | |
|---|---|---|---|
| 4,585,491 | 4/1986 | Burnham et al. | 148/1.5 |
| 5,048,040 | 9/1991 | Paoli | 372/23 |

FOREIGN PATENT DOCUMENTS

| | | |
|---|---|---|
| 63-32981 | 2/1988 | Japan . |
| 63-32986 | 2/1988 | Japan . |
| 64-27285 | 1/1989 | Japan . |
| 64-59978 | 3/1989 | Japan . |

OTHER PUBLICATIONS

Furuya et al., "AlGaAs/GaAs Lateral . . . Disordering", Japanese Journal of Applied Physics, vol. 26, No. 2, Feb. 1987, pp. L134–L135.
Furuya et al., "Arsenic Pressure . . . Quantum Well", Japanese Journal of Applied Physics, vol. 26, No. 6, Jun. 1987, pp. L296–L298.
Fukuzawa et al., "GaAlAs Buried . . . Disordering", Applied Physics Letters 45 (1), Jul. 1984, pp. 1–3.
Meehan et al., "Stripe-Geometry . . . Disordering", Applied Physics Letters 46 (1), Jan. 1985, pp. 75–77.
Guido et al., "Effects of Dielectric . . . Heterostructures", Journal of Applied Physics 61 (4), Feb. 1987, pp. 1372–1379.

Primary Examiner—James W. Davie
Attorney, Agent, or Firm—Leydig, Voit & Mayer

[57] ABSTRACT

An integrated semiconductor laser including at least two active regions, each active region oscillating at a respective, different wavelength, the integrated semiconductor laser including a common semiconductor substrate of a first conductivity type; a semiconductor first cladding layer of the first conductivity type disposed on the substrate; at least two spaced apart active regions disposed on the first cladding layer within a common active layer, the active layer including at least one compound semiconductor quantum well layer sandwiched between compound semiconductor quantum barrier layers, the quantum barrier layers having a larger energy band gap than and including at least one more element than the quantum well layer, the at least one more element of the quantum barrier layers penetrating farther into the quantum well layer at the first active region than into the quantum well layer at the second active region; a second cladding layer disposed on each of the first and second active regions; and respective electrical contacts to the first and second active regions through the first and second cladding layers disposed on opposite sides of each of the first and second active regions.

6 Claims, 7 Drawing Sheets

INTEGRATED SEMICONDUCTOR LASER

This application is a division of application Ser. No. 07/607,738, filed Nov. 1, 1990.

FIELD OF THE INVENTION

The present invention concerns an integrated semiconductor laser including at least two separate active regions, each active region producing light of a different wavelength, and to a method of making such an integrated semiconductor laser.

BACKGROUND OF THE INVENTION

Wavelength division multiplex optical communications systems are of growing importance in the transmission of large quantities of information, such as the transmission of images. Integrated lasers producing at least two light beams of different wavelengths are particularly useful in multiplexed transmission of information in optical communications systems. In those systems, an integrated laser producing at least two different wavelength laser beams simplifies optical alignments and optical matching.

Semiconductor lasers including two or more active regions, each active region producing light of a different wavelength, are known. However, the lasers require complicated manufacturing processes that result in poor production yields. An example of such an integrated semiconductor laser is described in Japanese published patent application 62-48917. The laser structure described in that publication is shown in a schematic perspective view in FIG. 7. A method of manufacturing that laser structure is shown in FIGS. 8(a)-8(d).

The laser of FIG. 7 includes three active regions disposed on a base including an n-type indium phosphide substrate 21 and an n-type indium phosphide buffer layer 22 disposed on the substrate. In a first active region, at the left of the structure as shown in FIG. 7, a first indium gallium arsenide phosphide active layer 31 is disposed directly on the buffer layer 22. The relative proportions of the constituents of the indium gallium arsenide phosphide active layer 31 are adjusted for laser oscillation at a first wavelength. In a central active region, layer 31 is also present and successively disposed on it are a first intermediate n-type indium phosphide layer 41 and a second indium gallium arsenide phosphide active layer 32. The relative proportions of the constituents of the second active layer 32 are adjusted for laser oscillation at a second wavelength different from the wavelength at which laser oscillations are produced in the first active layer 31. In a third active region, shown at the right side of FIG. 7, the same layers are present as in the central active region. In addition, a second n-type indium phosphide intermediate layer 42 and a third indium gallium arsenide phosphide active layer 33 are successively disposed on the first intermediate layer 41. The relative proportions of the constituents of the third indium gallium arsenide phosphide active layer 33 are adjusted for laser oscillation at a third wavelength different from the wavelengths produced in the first and central active regions. Each of the active regions is confined at its sides by a p-type indium phosphide current blocking layer 23 and an n-type indium phosphide current confining layer 24 disposed on layer 23. The active regions and the current confining layer 24 are covered by a p-type indium phosphide layer 25. Finally, an n-type indium gallium arsenide phosphide contact layer 26 is disposed on the p-type indium phosphide layer 25. A silicon dioxide film 27 is selectively disposed on the contact layer 26 and includes openings opposite each of the three active regions. Electrodes 51, 52, and 53 are disposed on the silicon dioxide film 27 and in contact with the contact layer 26 respectively opposite each of the active regions. To improve the quality of the contact, zinc is diffused through layer 26 and into layer 25 at regions 71, 72, and 73 respectively opposite the first, central, and third active regions. The electrodes 51, 52, and 53 respectively contact regions 71, 72, and 73. A common electrode 61 is disposed on the substrate opposite the buffer layer 22.

The process for manufacturing the laser structure of FIG. 7 is relatively complex. Steps in that process are illustrated in FIGS. 8(a)-8(d). As shown in FIG. 8(a), the buffer layer 22, the first active layer 31, the first intermediate layer 41, the second active layer 32, the second intermediate layer 42, and the third active layer 33 are successively grown on substrate 21. As illustrated in FIG. 8(b), the grown films are selectively etched to expose active layers 31, 32, and 33 over respective lengths of about two hundred microns. The active regions of the laser are then prepared by etching ridges 81, 82, and 83 lying along the <110> direction and having a width of two to three microns as illustrated in FIG. 8(c). The ridges are defined by respective etching masks 91, 92, and 93. Subsequently, as illustrated in FIG. 8(d), the current blocking layer 23 and current confining layer 24 are successively grown adjacent the sides of the ridges. Finally, the p-type indium phosphide layer 25 and the n-type contact layer 26 are successively grown on the current confining layer 24 and each of the ridges. Thereafter, diffusion masks, such as the layer 27, are deposited on the contact layer. The masks each include an opening disposed opposite the ridges 81, 82, and 83, typically of a width of about ten microns. Zinc is diffused through the openings in the diffusion masks to a depth to reach the p-type layer 25 and establish contact to the respective uppermost active layers at each ridge. Electrodes 51, 52, and 53 are deposited on the diffusion masks in contact with the respective zinc-diffused regions 71, 72, and 73. A common electrode 61 is deposited on the reverse side of the substrate.

In the resulting structure, each of the active regions can be separately forward biased and each oscillates at a different wavelength, providing three light beams that can be independently generated and modulated to increase the amount of information transmitted in an optical communications system. However, the method of manufacturing the integrated laser is so complicated that it is difficult to manufacture the structure economically.

Another integrated semiconductor laser structure having three active regions and a single substrate is shown in a perspective, partially cut-away view in FIG. 9. The active regions 101, 102, and 103 interact with respective diffraction gratings 201, 202, and 203. The periods of the respective diffraction gratings are different in order to produce different wavelength light at each of the active regions. The diffraction gratings are produced by a conventional technique in which interference fringes illuminate a resist film before its development and subsequent etching. However, it is difficult to control the different periods of the three gratings and each of the laser sections includes a wavelength control adjustment portion 301, 302, and 303, respectively, for tuning the oscillation wavelengths. An insulating film 400 separates the respective electrodes 501, 502, and 503 from the substrate. A common electrode 600 is disposed on the opposite side of the substrate. The three active regions, i.e., laser elements, are mutually isolated by grooves 701 and 702.

Like the structure of FIG. 7, the complex structure of FIG. 9 requires many complicated processing steps, particularly in the formation of several diffraction gratings, each having a different period. As a result, the production yield is very poor, resulting in high costs.

Accordingly, it would be desirable to produce an integrated laser including at least two active regions, each active region producing laser light at a different wavelength in a relatively simple process providing good product yield at reasonable product cost.

SUMMARY OF THE INVENTION

It is an object of the present invention to provide a relatively simple method for producing an integrated semiconductor laser including at least two active regions, each active region producing laser light at a different wavelength.

It is another object of the present invention to provide an integrated semiconductor laser including at least two active regions on a common substrate, each active region oscillating at a different wavelength.

According to a first aspect of the invention, a method of making an integrated semiconductor laser on a common substrate including at least two active regions, each active region oscillating at a respective, different wavelength, comprises producing a precursor laser structure by successively growing on a semiconductor substrate a first conductivity type semiconductor first cladding layer, an active layer including at least one compound semiconductor quantum well layer sandwiched between compound semiconductor quantum barrier layers, and a second conductivity type semiconductor second cladding layer, the quantum barrier layers having a larger energy band gap than and including at least one more element than the quantum well layer, annealing the precursor structure including controlling at first and second spaced apart regions the diffusion of the at least one more element from the quantum barrier layers into the quantum well layer to produce first and second spaced apart active regions in the active layer having different effective lasing energy band gaps, and forming respective electrical contacts to the first and second cladding layers on opposite sides of each of the first and second active regions.

According to a second aspect of the invention, an integrated semiconductor laser including at least two active regions, each active region oscillating at a respective, different wavelength, comprises a common semiconductor substrate of a first conductivity type, a semiconductor first cladding layer of the first conductivity type disposed on the substrate, at least two spaced apart active regions disposed on the first cladding layer within a common active layer, the active layer including at least one compound semiconductor quantum well layer sandwiched between compound semiconductor quantum barrier layers, the quantum barrier layers having a larger energy band gap than and including at least one more element than the quantum well layer, the at least one more element of the quantum barrier layers penetrating farther into the quantum well layer at the first active region than into the quantum well layer at the second active region, a second cladding layer disposed on each of the first and second active regions, and respective electrical contacts to the first and second active regions through the first and second cladding layers disposed on opposite sides of each of the first and second active regions.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those of skill in the art from the detailed description.

BRIEF DESCRIPTION OF DRAWING FIGURES

FIGS. 1(a)–1(g) illustrate a method of producing an integrated semiconductor laser according to the invention.

FIG. 2 is an energy band gap diagram of a potential well structure for explaining wavelength shift in a laser employing the potential well structure in an active region.

FIGS. 3(a)–3(f) illustrate a method of producing an integrated semiconductor laser according to the invention.

Figure 7:
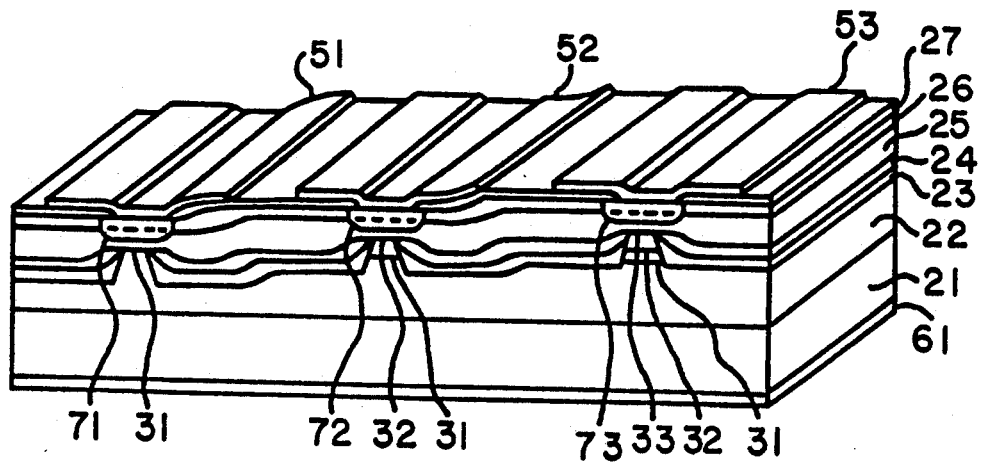
FIG. 7 is a schematic, perspective view of the structure of a prior art integrated semiconductor laser.
Figure 8A:
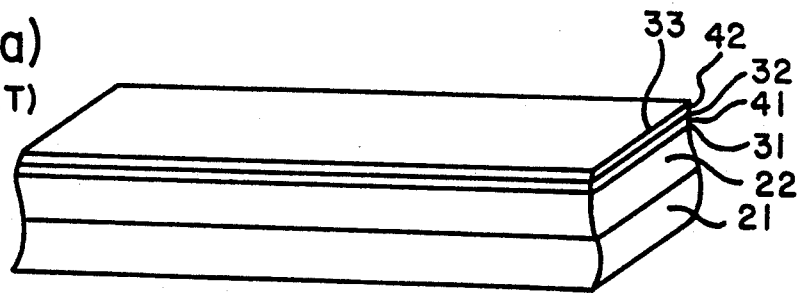
Figure 8B:
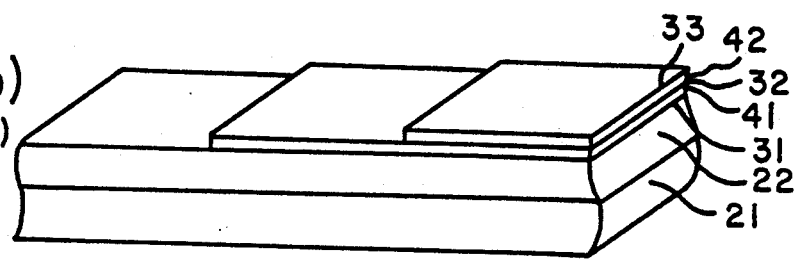
Figure 8C:
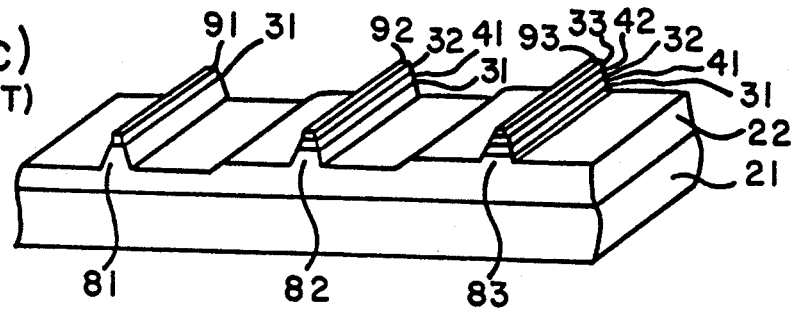
Figure 8D:
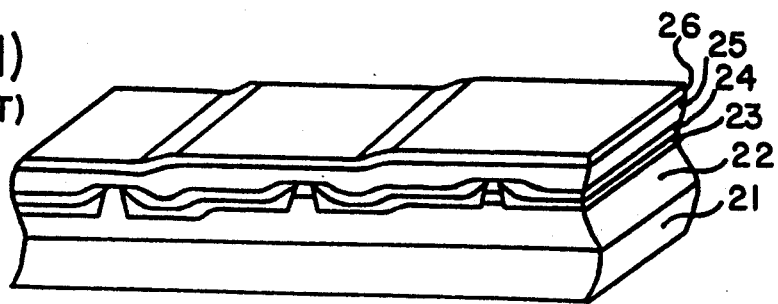

FIGS. 8(a)–8(d) illustrate steps in a method of manufacturing the laser structure of FIG. 7.

Figure 9:
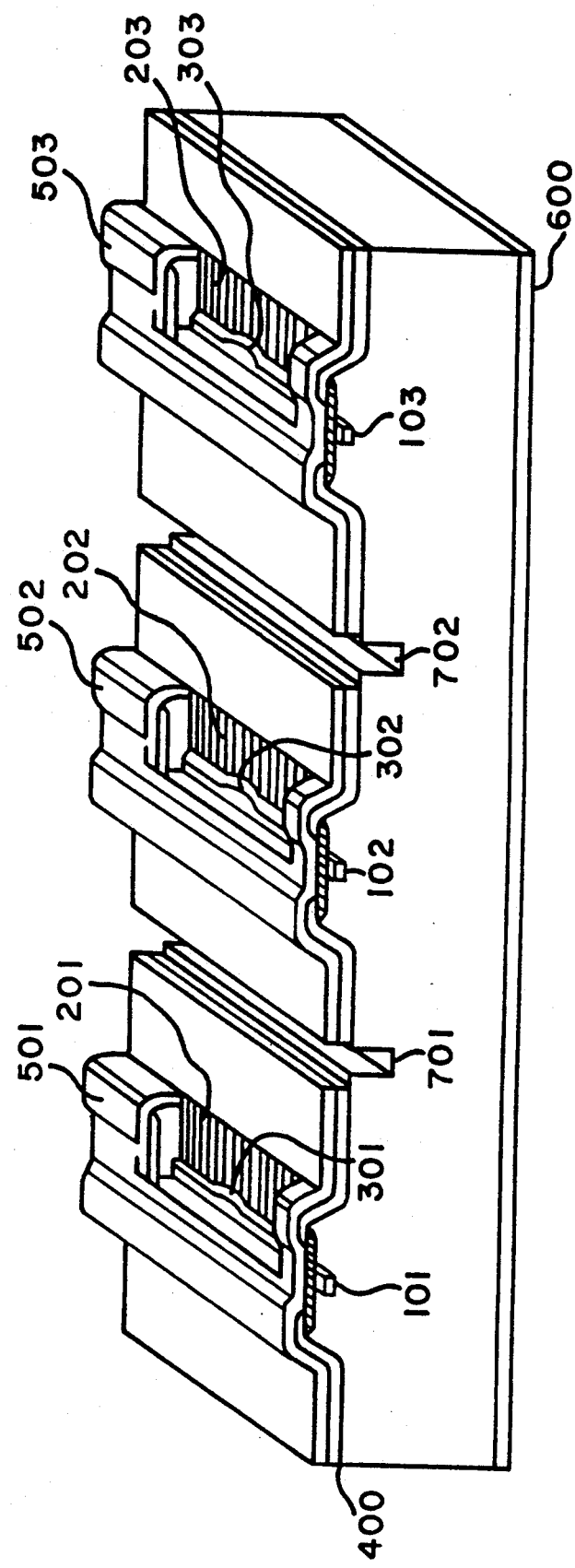

FIG. 9 is a schematic, perspective view of the structure of a prior art integrated semiconductor laser.

DETAILED DESCRIPTION OF PREFERRED EMBODIMENTS

Figure 1A:
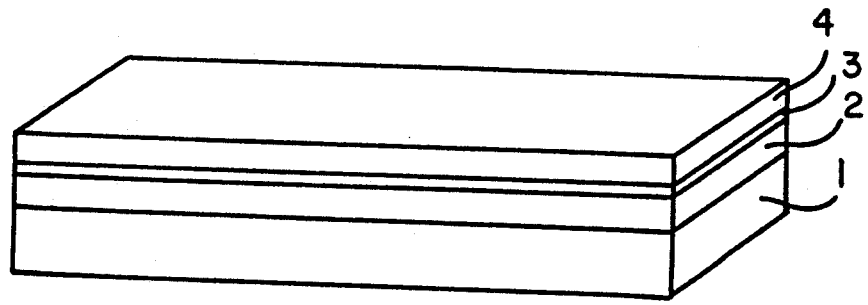

FIGS. 1(a)–1(g) illustrate a method of making an integrated semiconductor laser including at least two active regions according to an embodiment of the invention. Initially, as illustrated in FIG. 1(a), a precursor laser structure is produced by successively growing, on a p-type gallium arsenide substrate 1, a p-type aluminum gallium arsenide cladding layer 2, a gallium arsenide/aluminum gallium arsenide quantum well/quantum barrier structure as active layer 3, and an n-type aluminum gallium arsenide cladding layer 4. The quantum well structure includes at least one quantum well layer of gallium arsenide sandwiched between substantially identical barrier layers of aluminum gallium arsenide. While the embodiment of the invention described with respect to FIGS. 1(a)–1(g) and elsewhere herein includes a single quantum well layer sandwiched by two barrier layers, the invention encompasses a multiple quantum well structure including more that one quantum well layer sandwiched by respective quantum barrier layers.

Figure 1B:
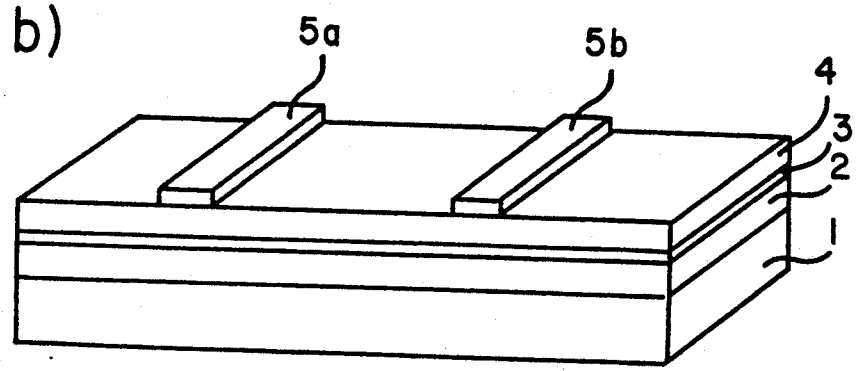

In FIG. 1(b), stripes 5a and 5b of dielectric materials are deposited on cladding layer 4 at two spaced apart regions. As described below, active regions of the integrated semiconductor laser are subsequently formed opposite the respective dielectric stripes. An important feature of the invention is the formation of the dielectric stripes 5a and 5b of different materials and/or of different thicknesses. While only two stripes 5a and 5b are shown in FIG. 1(b), resulting in the formation of two spaced apart active regions as described below, more than two dielectric stripes can be formed in order to form more than two active regions in the subsequent processing steps.

After the formation of the dielectric stripes, the precursor laser structure is subjected to an annealing treatment, for example, at 850° C. for several hours in an arsenic ambient. During the annealing step, the aluminum that is present in the aluminum gallium arsenide barrier layers within quantum well structure diffuses across the interfaces of the quantum barrier layers and the quantum well layer and into the quantum well layer where no aluminum is present initially. This interdiffusion alters the energy band edge configuration of the quantum well structure.

Figure 2:
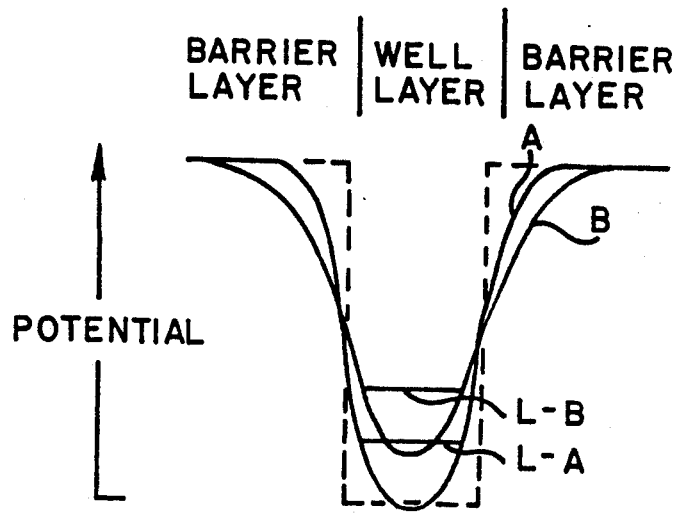

In FIG. 2, the alteration of the energy band configuration is illustrated for two different interdiffusions. Initially, the quantum well band edge has the idealized rectangular configuration shown by the dashed lines of FIG. 2. After a relatively small diffusion, the idealized rectangular potential well is altered to the gently curved band edge marked as A in FIG. 2. After still further diffusion, greater curvature is present in the energy band edge configuration, resulting in the energy band edge marked B in FIG. 2. These interdiffusions alter the effective depth of the potential well by making it shallower as the amount of interdiffusion increases, increasing the effective lasing energy band gap of the corresponding active region. As illustrated in FIG. 2, after the initial diffusion, the effective quantized energy level of the potential well is L-A, and, after a greater diffusion, the effective quantized energy level of the potential well is L-B. In a laser employing a quantum well structure active layer, the wavelength of the emitted light depends upon an energy transition between the energy level of electrons and the energy level of heavy holes. This energy transition is increased as the diffusion of aluminum into the quantum well layer increases, i.e., as the quantized energy level shifts from the bottom of the rectangular potential well to the level L-A, to L-B and so forth. The increase in the energy of the transition shifts the wavelength of laser light oscillation toward shorter wavelengths, i.e., higher energies, as the amount of interdiffusion increases.

It has been demonstrated experimentally that the degree of interdiffusion of an extra element from the quantum barrier layers into the quantum well layer for fixed time and temperature conditions depends upon several factors. For example, the rate of the interdiffusion is affected by the degree of passivation of the external surface closest to the quantum well structure. The degree of passivation depends upon whether the surface is protected from the ambient and, if protected, the material and thickness of the material providing the protection. For example, it has been experimentally demonstrated that different degrees of interdiffusion are produced when the surface protection is provided by silicon nitride, aluminum nitride, and silicon dioxide films. Amongst these three films, silicon nitride delays the interdiffusion the most and silicon dioxide delays the interdiffusion the least. The relative interdiffusion constants for aluminum from the barrier layer into the quantum well layer with surface passivation films of silicon nitride, aluminum nitride, and silicon dioxide in units of $10^{-18} cm^2/s$ are $\leq$ to 3, 4, and 17, respectively.

The mechanism that controls the rate of the interdiffusion of aluminum from aluminum gallium arsenide into gallium arsenide in the quantum well structure is not yet fully understood. It is believed that, in the gallium arsenide series of materials, arsenic is evaporated from the exposed surfaces during annealing. The resulting arsenic vacancies induce gallium vacancies that encourage aluminum diffusion to produce an aluminum vacancy. As a result, diffusion rates are affected by the relative difficulty of the creation of an arsenic vacancy at the exposed surfaces. Since the dielectric films increase the difficulty of creating arsenic vacancies, the rate of aluminum diffusion is affected by the presence, type, and thickness of each of the films. In the invention, this phenomenon is exploited by choosing the dielectric film materials of stripes 5a and 5b to produce different degrees of interdiffusion at different parts of the laser precursor structure, producing active regions having different effective lasing energy band gaps and, therefore, different wavelength light emissions. For example, the stripes 5a and 5b are chosen from silicon nitride, aluminum nitride, and silicon dioxide using a different material and/or different thicknesses of the same or different materials for each active region location.

Figure 1C:
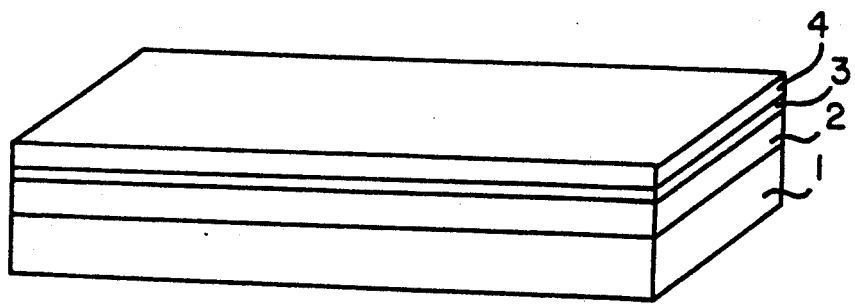

After the annealing step, as illustrated in FIG. 1(c), the dielectric stripes 5a and 5b are removed. The dielectric stripes have resulted in different degrees of aluminum diffusion into the quantum well layers in the active layer 3 opposite each of the locations where the dielectric stripes had been present and where the active regions will be present. Elsewhere in the active layer in the semiconductor precursor structure, larger and substantially identical interdiffusion has taken place, "smearing" or obliterating the quantum well structure.

Figure 1D:
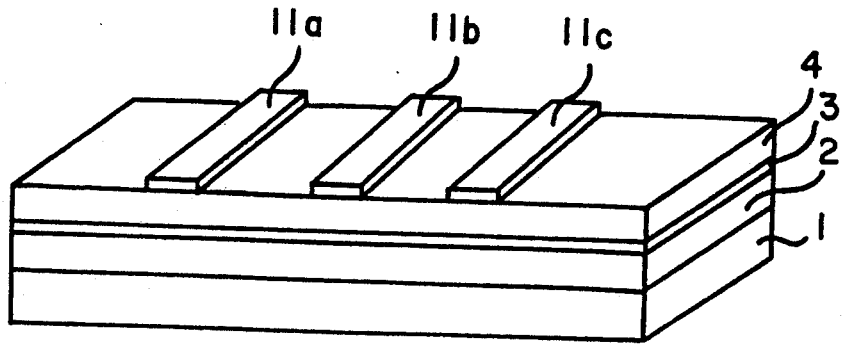
Figure 1E:
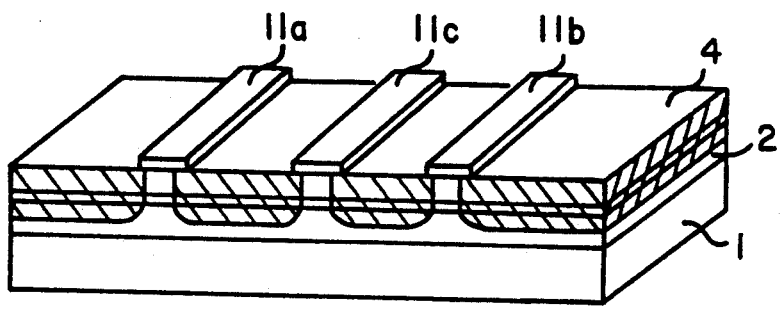

As illustrated in FIG. 1(d), a diffusion mask including three stripes 11a, 11b, and 11c is formed on cladding layer 4. Stripes 11a and 11b are aligned with and disposed on the same locations as dielectric stripes 5a and 5b. Diffusion mask stripe 11c is disposed intermediate of stripes 11a and 11b. A p-type dopant, such as zinc, producing the same conductivity type as that of substrate 1 is then diffused through the openings between stripes 11a, 11b, and 11c, penetrating through the cladding layer 4 and the active layer 3, and into the cladding layer 2 to form diffused regions 6. Where the regions 6 intersect the active layer, the zinc disorders the quantum well structure of the active layer 3. The disordered regions aid in confining light in the active regions. The zinc establishes electrical contact from the surface of cladding layer 4 to the cladding layer 2 and forms pn junctions with the portions of cladding layer 4 that have been protected from doping by the diffusion mask, i.e., stripes 11a, 11b, and 11c.

Figure 1F:
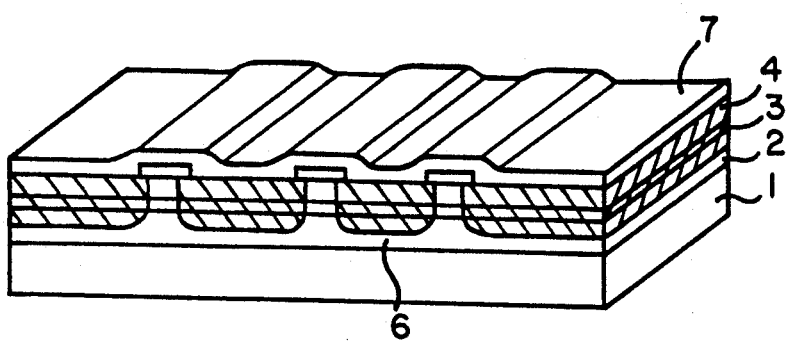

An electrically insulating layer 7, such as silicon dioxide, is then deposited, as shown in FIG. 1(f). As shown there, the silicon dioxide film may be deposited over the diffusion mask stripes 11a–11c. Preferably, stripes 11a–11c are removed before the electrically insulating film 7 is deposited. If those diffusion mask stripes are not initially removed, they are selectively removed, lifting off the electrically insulating film 7 and providing self-aligned access to n-type layer 4 at the regions in which zinc is not diffused. If, as preferred, the diffusion mask stripes are first removed, stripe apertures, narrower than the stripe masks, are opened in film 7 at each of the locations where a diffusion mask stripe 11a-11c was present.

Figure 1G:
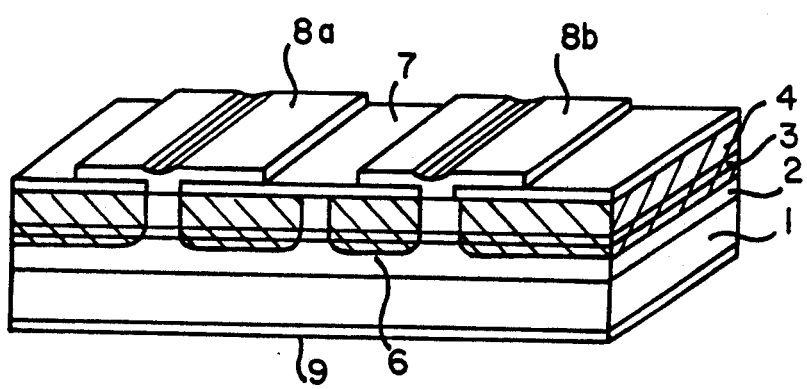

Finally, as illustrated in FIG. 1(g), electrodes 8a and 8b are deposited on electrically insulating film 7 respectively in contact with cladding layer 4 where dielectric stripes 5a and 5b and diffusion masks 11a and 11b had been present, i.e., between two of the diffused regions 6. A common electrode 9 is deposited on the rear surface of substrate 1 opposite cladding layer 2 to complete the structure.

The completed integrated laser includes a common substrate and two active regions, one opposite each of electrodes 8a and 8b, that respectively produce light of different wavelengths. The two active regions, i.e., laser elements, are totally electrically independent. By omitting the diffusion mask 11c shown in FIG. 1(e), the separation between two of the diffused regions 6 can be eliminated, simplifying the structure but increasing the potential for interaction between the two spaced apart active regions of the integrated semiconductor laser.

In operation, each of the laser structures has charge carriers injected into the respective active regions in active layer 3 from one of electrodes 8a and 8b and common electrode 9 through the respective cladding layers 4 and 2. The resulting charge carrier recombinations produce light that is confined by waveguides defined by the zinc diffused regions 6, resulting in laser oscillation at a wavelength determined by the degree of interdiffusion of aluminum into the respective quantum well layers.

The processing steps employed to produce the integrated semiconductor laser embodiment of FIG. 1(g) are relatively simple and far less complex than those required to produce the prior art structures of FIGS. 7 and 9. Moreover, the structure of the novel integrated semiconductor laser can be easily altered. The embodiment shown in FIG. 1(g) is a so-called vertical laser structure in which electrical current flows through and generally perpendicular to substrate 1 when the laser is in use. In an integrated circuit, it is desirable to provide all of the electrodes at the same surface. That horizontal-type laser can be obtained by altering the steps described with respect to FIGS. 1(a)-1(g). Instead of forming diffused regions 6 of the same conductivity type, diffused regions of alternating conductivity types can be produced with the electrodes for each laser structure being respectively disposed on the p-type and n-type diffused regions on opposite sides of a particular active region. Such a structure is shown in FIG. 3(f) and described below with respect to a different technique for establishing separate active regions oscillating at different wavelengths.

Figure 3A:
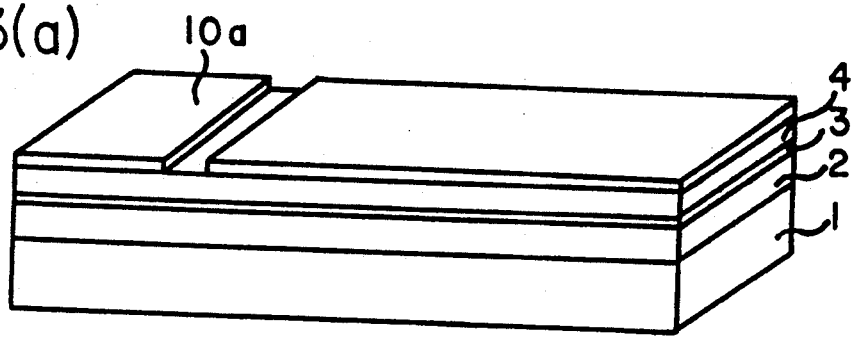
Figure 3B:
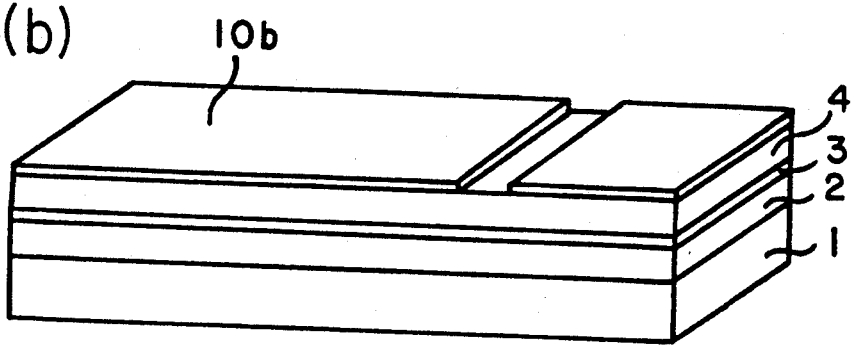
Figure 3C:
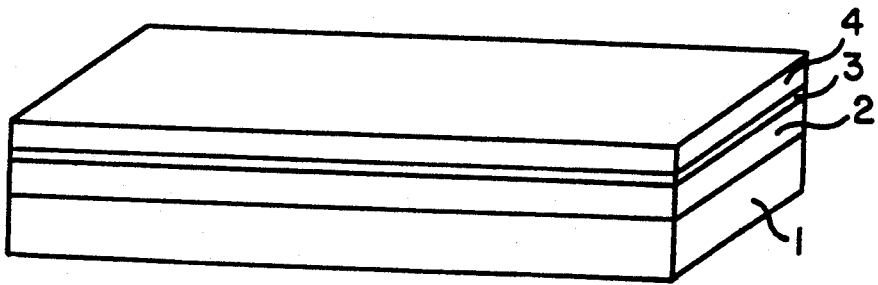
Figure 3D:
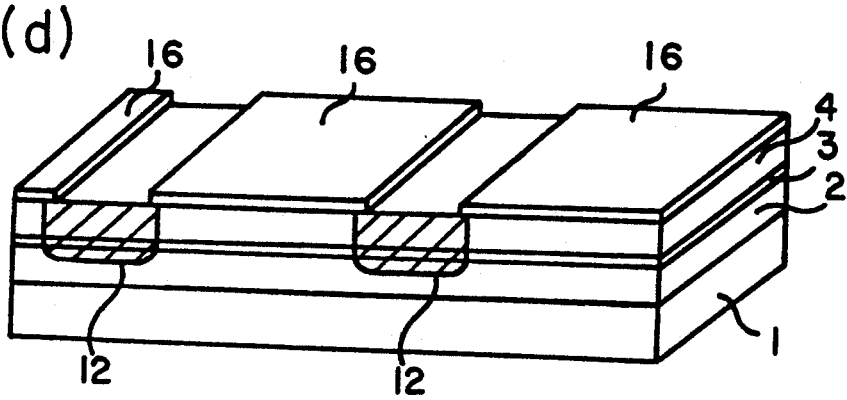
Figure 3E:
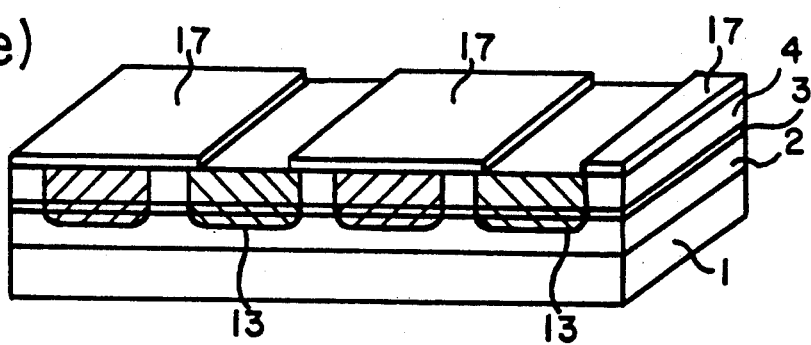
Figure 3F:
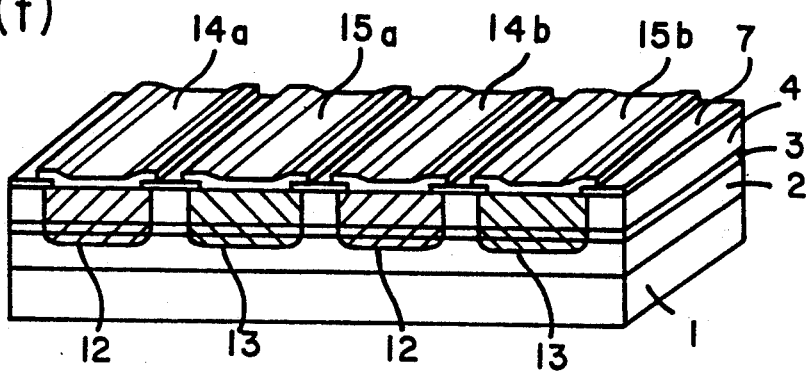

Another embodiment of the invention is described with respect to FIGS. 3(a)-3(f). Those figures illustrate process steps for making a so-called horizontal integrated semiconductor laser in which all electrodes are accessible from the same surface. As illustrated in FIG. 3(a), the same laser precursor structure shown in FIG. 1(a) is first prepared by a conventional epitaxial growth process, such as metal organic chemical vapor deposition (MOCVD), molecular beam epitaxy (MBE), and the like. The same elements in FIGS. 3(a)-3(f) that appear in FIGS. 1(a)-1(g) are given the same reference numbers. As shown in FIG. 3(a), a silicon nitride film 10a has been deposited on the cladding layer 4 and a stripe of the film has been removed opposite the location where one of the active regions is to be formed. Thereafter, a heat treatment, i.e., annealing step, is carried out with a fixed arsenic ambient pressure. As well known in the art, an excess pressure of arsenic must be present when annealing gallium arsenide and similar arsenic-containing compound semiconductor materials at high temperatures to avoid decomposition of those materials. Within the semiconductor laser precursor structure, very little interdiffusion of aluminum from the barrier layers into the well layer occurs where the silicon nitride film is present, as already described. On the other hand, where the cladding layer 4 is exposed through the opening in the silicon nitride layer, aluminum diffuses relatively rapidly from the quantum barrier layers into the quantum well layer, all within the quantum well structure 3.

Figure 4:
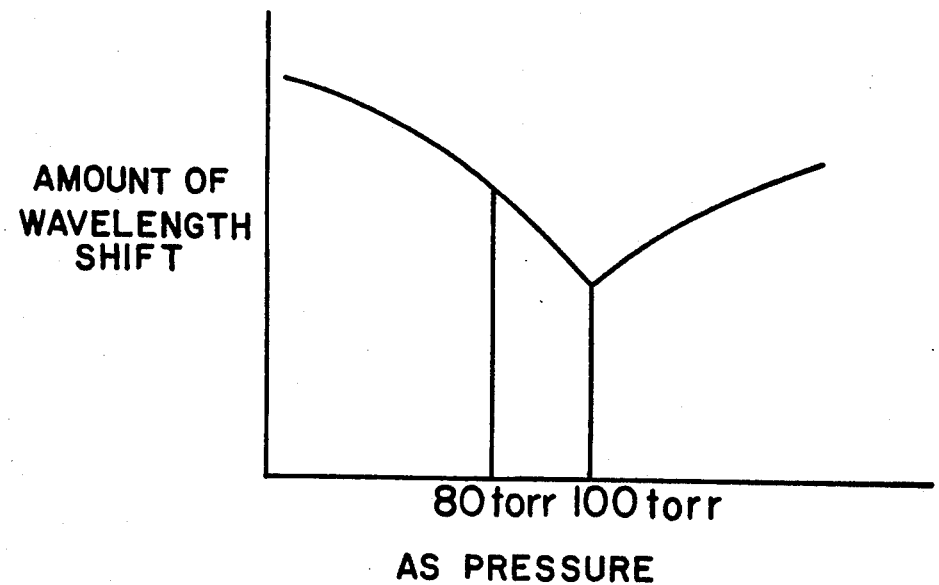
FIG. 4 is a diagram showing the relationship between wavelength shift observed in a laser and arsenic pressure during an annealing step in the production of the laser.

It is well known that the rate of aluminum interdiffusion into the well layer is dependent upon the arsenic ambient pressure. While the mechanism of this dependence is not fully understood, as discussed above, it is believed that the creation of arsenic vacancies affects the rate of aluminum interdiffusion. As a result, differences in ambient arsenic pressures during separate annealing steps result in different amounts of aluminum interdiffusion. In other words, referring again to FIG. 2, annealing at similar temperatures and times, but at different ambient arsenic pressures, produces different amounts of interdiffusion and different changes in the band edge configuration of the quantum well structure. Thereby, the effective lasing energy band gap of an active region can be controlled by controlling the arsenic ambient pressure during annealing. In FIG. 4, the relationship between changes in the wavelength of oscillation of an active region with arsenic ambient pressure during annealing steps for the same time and temperature is plotted. As shown there, the oscillation wavelength declines as the arsenic ambient pressure is increased until the pressure reaches about 100 Torr. At higher arsenic pressures, the wavelength increases.

In the first annealing step illustrated in FIG. 3(a), the arsenic ambient pressure is about 100 Torr to produce the maximum shift in laser wavelength for the active region opposite the stripe opening in the mask 10a. After the first annealing step, the silicon nitride film 10a is removed and is replaced by a second silicon nitride film 10b including a second stripe where the film 10b is missing. The position of the stripe opening in the film 10b determines the location of the second active region. This second silicon nitride film is illustrated in FIG. 3(b). The structure is annealed a second time, this time at a lower arsenic ambient pressure, for example, 80 Torr, than during the first annealing step to produce greater interdiffusion of aluminum from the quantum barrier layers into the quantum well layer at the second active region and a smaller change in wavelength than achieved in the first annealing step. Since the silicon nitride film inhibits diffusion of aluminum into the quantum well layer, the two annealing steps produce significant changes in the band edge configuration of the quantum well structure in active layer 3 only opposite the respective missing stripes, i.e., openings, in the films 10a and 10b.

While the foregoing steps have been described with respect to changing the ambient arsenic pressure only, the same results can be obtained even if the ambient arsenic pressure is identical during the two annealing steps if other variables, such as the times and/or temperatures of the respective annealing steps, are varied.

After the two annealing steps, the second silicon nitride film 10b is removed, leaving the structure of FIG. 3(c). As shown in FIG. 3(d), a third silicon nitride film 16 is deposited on the cladding layer 4. Film 16 includes two stripe openings where the film 16 is missing. Each stripe, in the embodiment illustrated in FIG. 3(d), is disposed to one side of a respective active region in which aluminum interdiffusion has taken place. In other words, each of the stripe openings in film 16 lies to one side, the left side as illustrated in FIG. 3(d), of one of the openings that was present in films 10a and 10b, i.e., where the active regions will be located. Film 16 functions as a diffusion mask and a dopant is diffused through the openings in the film to form diffused contact regions 12, penetrating through cladding layer 4 and active layer 3 and reaching into cladding layer 2. The dopant may be zinc if p-type regions are formed.

Thereafter, film 16 is removed and a fourth silicon nitride film 17 is deposited as a diffusion mask. Film 17 also includes stripe openings, as shown in FIG. 3(e). Each of those openings lies on the opposite side of a respective active region from a diffused contact region 12. A dopant producing the opposite conductivity type from that of regions 12 is diffused through the openings in film 17, penetrating through cladding layer 4 and active layer 3 and reaching into cladding layer 2 to form diffused contact regions 13. When diffused contact regions 12 are p-type, silicon may be diffused to form n-type diffused contact regions 13. These steps produce p-type and n-type regions on the opposite side of each active region. The diffused contact regions also disorder the active layer 3 adjacent to the active regions, forming a light-confining cavity at each of the respective active regions.

Finally, as shown in FIG. 3(f), film 17 is removed and an insulating film, such as silicon dioxide, is deposited on cladding layer 4 and an opening is made in the insulating film 7 opposite each of the diffused contact regions 12 and 13. Electrodes 14a and 14b are deposited respectively in contact with one of the p-type contact regions 12 and electrodes 15a and 15b are deposited respectively in contact with one of the n-type contact regions 13, completing the laser structure.

As in the embodiment of FIG. 1(g), each laser element in the integrated laser can be operated independently. Current flows between pairs of diffused contact regions 12 and 13 laterally, i.e., generally parallel to substrate 1. The current flow passes through one diffused contact region into the cladding layer of the same conductivity type as that diffused contact region, through the active region to the cladding layer of the other conductivity type, and then through the other diffused contact region which is the same conductivity type as the other cladding layer. Thus, the electrical contacts are made through the respective cladding layers as in the embodiment of FIG. 1(g) but the direction of current flow is different. The currents flowing through the respective active regions result in carrier recombinations that produce laser light.

Although the p-type and n-type diffused contact regions 12 and 13 are disposed in an alternating arrangement in FIG. 3(f), the openings in the diffusion masks 16 and 17 can be altered so that neighboring diffused contact regions have the same conductivity type. If extreme isolation between different laser elements is not essential, adjacent common conductivity type diffused contact regions can be merged and a single electrode may be commonly employed in driving more than one of the active regions. Since the embodiment of the invention shown in FIG. 3(f) provides access to all electrodes of the laser structure from one side of the substrate, it is convenient for use in monolithic circuitry.

It is apparent from a comparison of FIGS. 1(c)–1(g) to FIGS. 3(c)–3(f) that the electrode structures shown in FIGS. 1(g) and 3(f) can be alternatively employed with structures made by either the processes illustrated in FIGS. 1(a) and 1(b) or FIGS. 3(a) and 3(b). In other words, the monolithic structure of FIG. 3(f) can employ active regions prepared by selectively masking portions of cladding layer 4 during annealing and the two-sided structure of FIG. 1(g) can be prepared with active regions formed in separate annealing steps at different arsenic ambient pressures, times, and/or temperatures.

The embodiments of the invention described above include gallium arsenide substrates and layers and a gallium arsenide quantum well layer sandwiched between aluminum gallium arsenide barrier layers. However, the invention is not limited to those materials. For example, indium gallium arsenide and aluminum gallium indium arsenide may be employed as the quantum well and quantum barrier layer materials, respectively. Indium gallium phosphide and aluminum gallium indium phosphide may also be employed as quantum well and quantum barrier layer materials, respectively. Aluminum gallium indium phosphide advantageously provides a good lattice match to a gallium arsenide substrate and these materials do not exhibit a change in lattice constant when aluminum interdiffuses from the barrier layer into the quantum well layer. Indium phosphide and indium gallium arsenide phosphide may be employed as quantum well and quantum barrier materials, respectively. Indium gallium arsenide phosphide provides a good lattice match to an indium phosphide substrate, although some lattice constant change upon diffusion of arsenic from the quantum barrier to the quantum well layer takes place, resulting in some stresses. An important feature of each of these pairs of materials is the presence in the barrier layer material of at least one more element than is initially present in the quantum well material. That additional element increases the band gap of the quantum barrier material relative to the quantum well material and diffuses, at an elevated temperature, into the quantum well layer to change its energy band gap configuration.

Figure 5:
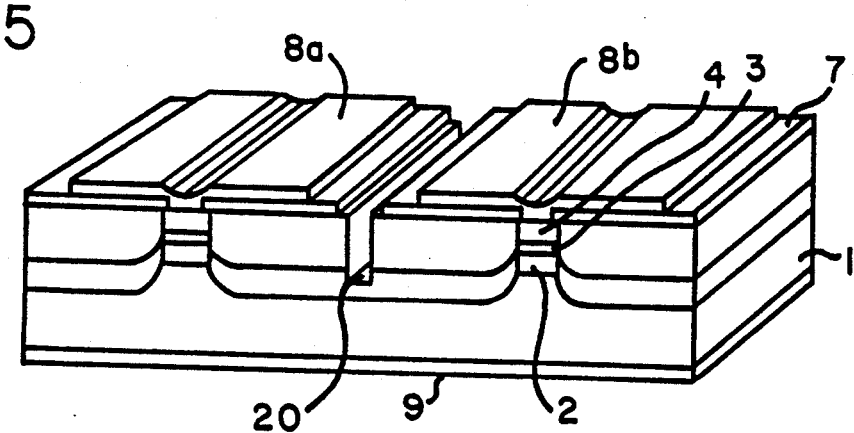
FIG. 5 is a schematic, perspective view of an integrated semiconductor laser according to an embodiment of the invention.
Figure 6:
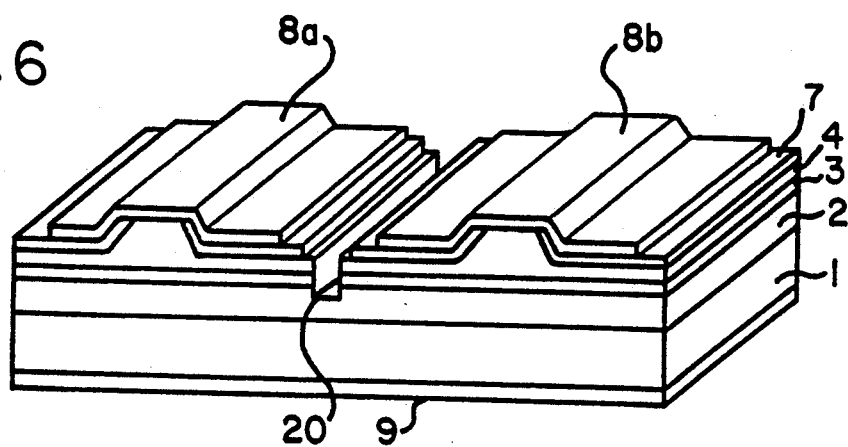
FIG. 6 is a schematic, perspective view of an integrated semiconductor laser according to an embodiment of the invention.

While emphasis has been placed upon the structures of FIGS. 1(g) and 3(f), the invention is not limited to those structures. Alternative embodiments of integrated lasers including at least two spaced apart active regions are illustrated in FIGS. 5 and 6. In FIG. 5, two separate active regions formed from a common active layer 3 are each surrounded by n-type and p-type layers successively disposed on substrate 1. The n-type layer 18 is disposed directly on substrate 1 in contact with cladding layer 2. P-type layer 19 is in contact with both cladding layers 2 and 4 as well as the active layer 3 at both sides of the active region. The individual laser elements are further isolated by a groove 20 extending through p-type layer 19 and into n-type layer 18. A common electrode 9 is disposed on the rear side of the common substrate 1. Each active region has a separate second electrode 8a and 8b.

The integrated laser structure shown in FIG. 6 also includes a groove 20 isolating the two active regions within active layer 3. The groove 20 extends through cladding layer 4 and active layer 3 and into cladding layer 2. Each laser element in the integrated structure of FIG. 6 includes a ridge opposite its respective active region. Otherwise, the elements of the integrated semiconductor laser shown in FIG. 6 are the same as those already identified by the same reference numbers in describing other embodiments of the invention.

The integrated laser structures of FIGS. 1(g) and 3(f) each include two active regions. However, the invention is not limited to an integrated laser with only two active regions. Three or more active regions can be present in an integrated laser according to the invention. Additional active regions can be formed in the processing steps of FIGS. 1(a)-1(g) by including additional masking stripes of different materials and/or thicknesses in the step illustrated in FIG. 1(b). Additional masking and annealing steps like those of FIGS. 3(a) and 3(b) would be employed in the processing according to FIGS. 3(a)-3(f) to produce more than two active regions in an integrated laser structure. Additional electrodes would be applied to either embodiment for driving the additional laser elements.

I claim:

1. An integrated semiconductor laser including at least two active regions, each active region oscillating at a respective, different wavelength, comprising:
   a common semiconductor substrate of a first conductivity type;
   a semiconductor first cladding layer of the first conductivity type disposed on said substrate;
   at least first and second spaced apart active regions disposed on said first cladding layer within a common active layer, said active layer including at least one compound semiconductor quantum well layer sandwiched between compound semiconductor quantum barrier layers, said quantum barrier layers having a larger energy band gap than and including at least one more element than said quantum well layer, said at least one more element of said quantum barrier layers penetrating farther into said quantum well layer at said first active region than into said quantum well layer at said second active region;
   a second cladding layer of a second conductivity type opposite the first conductivity type disposed on each of said first and second active regions, said first cladding layer, said active layer, and said second cladding layer including first and second opposed facets transverse to said first and second cladding layers and said active layer, said facets forming resonators with said first and second active regions; and
   respective electrical contacts to said first and second active regions through said first and second cladding layers disposed on opposite sides of each of said first and second active regions.

2. The integrated semiconductor laser of claim 1 wherein said electrical contact through said first cladding layer comprises a common electrode disposed on said substrate opposite said first cladding layer and said electrical contacts through said second cladding layer comprise respective second electrodes disposed on said second cladding layer opposite each of said first and second active regions.

3. The integrated semiconductor laser of claim 2 wherein said first and second active regions are mutually isolated by a groove penetrating said second cladding layer.

4. The integrated semiconductor laser of claim 2 wherein said electrical contacts include diffused regions of the first conductivity type penetrating said second cladding layer and said active layer and extending into said first cladding layer adjacent to each of said first and second active regions, disordering said active layer adjacent each of said first and second active regions.

5. The integrated semiconductor laser of claim 4 including an electrically insulating film disposed on said second cladding layer, electrically isolating said second electrodes from said second cladding layer outside said diffused regions.

6. The integrated semiconductor laser of claim 1 wherein said electrical contact through said first cladding layer comprises a respective diffused region of the first conductivity type extending through said second cladding layer and said active layer and into said first cladding layer adjacent to one side of each of said first and second active regions and said contact through said second cladding layer comprises a respective diffused region of the second conductivity type extending through said second cladding layer and said active layer and into said first cladding layer adjacent to another side of each of said first and second active regions and electrodes disposed on said second cladding layer respectively in contact with each of said diffused regions.

* * * * *